United States Patent
Li et al.

(10) Patent No.: US 6,264,476 B1
(45) Date of Patent: Jul. 24, 2001

(54) WIRE SEGMENT BASED INTERPOSER FOR HIGH FREQUENCY ELECTRICAL CONNECTION

(75) Inventors: Che-yu Li; Matti A. Korhonen; Weimin Shi, all of Ithaca, NY (US)

(73) Assignee: High Connection Density, Inc., Ithaca, NY (US)

( * ) Notice: Subject to any disclaimer, the term of this patent is extended or adjusted under 35 U.S.C. 154(b) by 0 days.

(21) Appl. No.: 09/457,776

(22) Filed: Dec. 9, 1999

(51) Int. Cl.$^7$ .................................................. H01R 9/09
(52) U.S. Cl. ............................................. 439/66; 439/86
(58) Field of Search ........................ 439/65, 66, 71, 439/91, 591; 361/719, 86

(56) References Cited

U.S. PATENT DOCUMENTS

| Re. 35,733 | 2/1998 | Hernandez et al. | 361/734 |
| 5,101,553 | 4/1992 | Carey | 29/882 |
| 5,127,837 | 7/1992 | Shah et al. | 439/71 |
| 5,215,472 | 6/1993 | DelPrete et al. | 439/71 |
| 5,228,861 | 7/1993 | Grabbe | 439/66 |

(List continued on next page.)

OTHER PUBLICATIONS

Almquist, Frank, 1989, "Button Contacts for Liquid Nitrogen Applications", Proceedings of the 1989 Electronic Components and Technology Conference, pp. 88–91, IEEE No. 0569–5503/89/0088.

(List continued on next page.)

Primary Examiner—Gary Paumen
Assistant Examiner—Alexander Gilman
(74) Attorney, Agent, or Firm—Brown & Michaels, PC (57) ABSTRACT

An interposer for a land grid array includes a dielectric grid having an array of holes and a resilient, conductive button disposed in one or more of the holes. The button includes an insulating core, a conducting element wound around the insulating core, and an outer shell surrounding the conducting element. The characteristics of the conducting element and the buttons may be chosen such that the contact force and resistance, and compressibility or relaxability of the conductive buttons can be selected within wide limits. Contact areas between the shell and the conducting element urge a substantially corresponding displacement in both the conducting element and the shell when the button is under compression or relaxation. The interposer alternatively can include an insulating sheet and rather than conductive buttons contain conducting elements disposed therein having contact areas with the block.

The interposer when positioned between a land grid array and an electrical circuit component can accommodate relatively large nonplanarity between respective mating surfaces of the two interconnected components while establishing and maintaining contact between each conducting element and the opposing contact pads of each component. A high local contact force is produced at each end of the conducting element against an opposing electrical contact or contact pad of a circuit device to establish a good electrical connection with the interposer which thus electrically interconnects the land grid array and the circuit component. The new interposer design is eminently amenable to high frequency and high current applications.

48 Claims, 4 Drawing Sheets

U.S. PATENT DOCUMENTS

| | | | |
|---|---|---|---|
| 5,232,372 | | 8/1993 | Bardley et al. ............... 439/66 |
| 5,308,252 | | 5/1994 | Mroczkowski et al. ............... 439/66 |
| 5,350,308 | | 9/1994 | Laska et al. ............... 439/91 |
| 5,385,477 | * | 1/1995 | Vaynkof et al. ............... 439/66 |
| 5,403,194 | * | 4/1995 | Yamazaki ............... 439/66 |
| 5,427,535 | * | 6/1995 | Sinclair ............... 439/66 |
| 5,441,690 | | 8/1995 | Ayala-Esquilin et al. ............... 264/277 |
| 5,473,510 | | 12/1995 | Dozier, II ............... 361/549 |
| 5,495,397 | | 2/1996 | Davidson et al. ............... 361/784 |
| 5,599,193 | | 2/1997 | Crotzer ............... 439/66 |
| 5,653,598 | | 8/1997 | Grabbe ............... 439/66 |
| 5,791,914 | | 8/1998 | Loranger et al. ............... 439/71 |
| 5,800,184 | | 9/1998 | Lopergolo et al. ............... 439/66 |
| 5,806,181 | | 9/1998 | Khandros et al. ............... 29/874 |
| 5,810,607 | | 9/1998 | Shih et al. ............... 439/66 |
| 5,817,986 | | 10/1998 | Davidson et al. ............... 174/250 |
| 5,823,792 | | 10/1998 | Regnier ............... 439/66 |
| 5,833,471 | | 11/1998 | Selna ............... 439/73 |
| 5,949,029 | | 9/1999 | Crotzer et al. ............... 174/254 |
| 6,074,219 | * | 6/2000 | Tustaniwskyj et al. ............... 439/66 |

OTHER PUBLICATIONS

Cinch Connectors, a division of Labinal Components and Systems, Inc., "CIN::APSE" 1999, 2 pages.

Shih, D.Y et al, 1995, "A Novel Elastomeric Connector for Packaging Interconnections, Testing and Burn–in Applications", Proceedings of the 1995 Electronic Components and Technology Conference, pp. 26–133.

Yamaguchi, M. et al, 1999, "Development of Novel Anisotropic Conductive Film (ACF)", 1999 Electronic Components and Technology Conference, pp 360–364.

Timoshenko, F., 1956, "Strength of Materials", Part II, Advanced Theory and Problems, section 54,;;292–299.

Bandyyopahyay et al, "Importance of Damping and Resonance in Thin–Film Integrated Decoupling Capacitor Design", Proc. of the $6^{th}$ Topical Meeting on Electrical Performance of Electronic Packaging, 1997, pp 31–34.

Beker et al, "Electrical performance of Integrated Decoupling Capacitor Arrays", Proc. Of the $5^{th}$ Topical Meeting on Electrical Performance of Electronic Packaging, 1996, pp 83–85.

Thomas&Betts, "Chip–to–Board MPI/LGA Socket", Thomas & Betts Corporation—Summary of Test Methods & Specification, 5 pages.

Grabbe, Dimitry, 1991, "High Density Electronic Connector (Micro Interposer) for High Speed Digital Applications", AMP Journal of Technology, vol. 1, Nov., pp. 80–90.

* cited by examiner

WIRE SEGMENT BASED INTERPOSER FOR HIGH FREQUENCY ELECTRICAL CONNECTION

FIELD OF THE INVENTION

The invention pertains to the field of interposers for electrical connection of opposed contact pads. More specifically, the invention pertains to the field of microelectronics connectors suitable for chip- or board level connections using an interposer between the contact pads of two circuits to be mated.

BACKGROUND OF THE INVENTION

Modern electronics equipment that includes components such as integrated circuits typically employ interconnection devices and techniques for electrically interconnecting printed circuit boards or other components. Interconnection between the conductive pads or leads of a component to the conductive pads or traces of a circuit can be accomplished in a number of ways, such as with solder. In instances where the removal, replacement, or testing of components or a device is necessary during the lifetime of the device, some suitable electrical connector or disconnect is often used.

A "land grid array" (LGA) is an example of such a connection, in which the two circuit elements to be connected each have a plurality of contact points, arranged in a line or two-dimensional array. An array of interconnection elements, known as an "interposer", is placed between the two arrays to be connected, and provides the electrical connection between the contact points or pads.

LGA interposers described in the prior art are typically conductive buttons made of solid metal springs or metallized particles inserted in an array of appropriately-located holes in a sheet of insulating material. Another prior art conductive button is made entirely of randomly wound and compressed mesh of solid wires.

Interposers also are known that instead of conductive buttons or the like comprise a continuous dielectric film, typically an elastomer, that may contain uniformly distributed or localized metallic wires, particles or flakes or metallized polymer particles, called an "anisotropically conducting" film. In such an array, the conducting elements form so dense a mesh that so that they are not in register with the conducting pads of either circuit to be connected.

When conductive structures embedded in a polymer matrix is used, bending, buckling, and compression of such structures is said to be "on elastic foundation." (S. Timoshenko, Strength of Materials II, VanNostrand, Princeton, 1956, and S. Timoshenko and J. M. Gere, Theory of Elastic Stability, McGraw-Hill, New York, 1961).

A deficiency common to many such prior art interposers is that they may not provide good electrical conduction paths while maintaining desirably low overall contact forces. In other words, the mating surfaces of the interposer can exert undesirably high contact forces to produce the desired local contact force necessary for good electrical contact at the conducting elements disposed within the conductive button, film, or carrier.

Dozier, U.S. Pat. No. 5,473,510, "Land Grid Array Package/Circuit Board Assemblies and Methods for Constructing the Same", shows a land grid array for joining electrical components using compressible socket conductor pins arrayed in sockets, an arrangement that is dependent on the socket thickness to limit the compressibility when torque is applied to screws that join the assembly.

Mroczkowski, et. al, U.S. Pat. No. 5,308,252, "Interposer Connector and Contact Element Therefor", discloses an electrical contact design for an interposer. The individual contact elements for the interposer are "double-S" shaped pieces of metal which compress to make electrical contact.

Grabbe, U.S. Pat. No. 5,653,598, "Electrical Contact with Reduced Self-Inductance" describes a land grid array connector that includes an insert having coil springs for electrically connecting contact pads of circuit components. In this spring interposer, the pitch is 70 mil, and it is very difficult to scale down. Also it needs a high insertion force, and is of high cost because the parts for each interposer connection are individually made and assembled. Another description of a similar system to this patent was reported by the inventor in 1991 in the AMP Journal of Technology, vol. 1, pp.80–90, in an article entitled "High Density Electronic Connector (Micro Interposer) for High Speed Digital Applications."

Grabbe, U.S. Pat. No. 5,228,861, "High Density Electrical Connector System", uses an array of "X" shaped contact elements on an insulating sheet, in which the ends of the arms of the "X" are bent up or down to make contact with the contact pads.

Crotzer, U.S. Pat. No. 5,599,193, "Resilient Electrical Interconnect" and Crotzer, et. al, U.S. Pat. No. 5,949,029 describe the conductive polymer button based interposer system sold by Thomas & Betts Corp, of Memphis, Tenn., under the name "Metallized Particle Interconnect" (WPI). Being elastomer based, MPI suffers from relaxation of contact force over time, needs a high insertion force to offset deficiencies in planarity of the circuits to be connected, and, being based on silver flakes, is of relatively high cost. In addition, this connector is known to be very susceptible to intermittent opens during mechanical vibration tests.

In an article entitled, "Button Contacts for Liquid Nitrogen Applications", Almquist described a "Fuzz Button" connector system (See *Proceedings of the 1989 Electronic Components and Technology Conference*, 1989, p. 88; IEEE no. 0569-5503/89/0088): "The 'Fuzz Button' is a cylinder of gold plated wire, in most cases copper/two percent silver, fifty microns in diameter, formed into sizes to fit the product application. The buttons are inserted into 0.5 mm holes in an 0.75 mm epoxy glass carrier."

Cinch Connectors, a division of Labinal Components and Systems, Inc., of Lombard, Ill., markets a "fuzz button" connector system, under the trademark "CIN::APSE". Being almost solid, it suffers from a high insertion force, and fabrication cost. The cost is typically 5–10 times higher than what would be desirable at present.

Lopergolo, U.S. Pat. No. 5,800,184, "High Density Electrical Interconnect Apparatus", uses parallel metal elements to make the contact between the contact pads in the array. The metal elements may be rods, or might have bent wire parts at the ends.

Ayala-Equillin, et. al, U.S. Pat. No. 5,441,690, "Process of Making Pinless Connector", and Shih, et. al, U.S. Pat. No. 5,810,607, "Interconnector with Contact Pins Having Enhanced Durability", both teach design and fabrication of inclined metal wires through a polymer film. Being continuous, the film is rigid and needs a high insertion force, the film is also very expensive to fabricate as it includes such individual steps as wire bonding. This system is also described in a paper by inventor Shih and others entitled "A Novel Elastomeric Connector for Packaging Interconnections, Testing and Burn-in Applications", *Proceedings of the 1995 Electronic Components and Technology Conference*, 1995, p. 126; IEEE no. 0569-5503/95/0000-0126.

Bradley, et. al, U.S. Pat. No. 5,232,372, "Land Grid Array Connector and Method of Manufacture", uses separate coil springs set on their sides on rod-like carriers as the connection elements.

Carey, U.S. Pat. No. 5,101,553, "Method of Making a Metal-on-Elastomer Pressure Contact Connector", produces an array of semicircular contact wires in an elastomeric interposer sheet by embedding coils of wire lengthwise in rows along the sheet, then cutting off the loops of wire which protrude above and below the elastomer. The result is rows of contact wires, spaced in one dimension by the coil spacing and in the other dimension by the thickness of the coil and the spacing between coils. The wire of necessity has to be rather thick, and controlling the position of the contacts is difficult, since at any point the position of the wire depends on where on the coil the wire happens to be when the loops are cut.

Researchers at Nitto Denko Corporation, reported on a very high density anisotropic film, where metal wires are mounted perpendicularly through a polymer film ("Development of Novel Anisotropic Conductive Film (ACF)", Miho Yamaguchi, Fumiteru Asai, Fuyuki Eriguchi, Yuji Hotta *Proceedings of the 1999 Electronic Components and Technology Conference*, Jun. 1–4, 1999; San Diego, Calif.; p.360). As with the Shih, et. al interposer, this design necessitates very high insertion force (about 2000 lbs for a square inch module). Therefore, the design is suitable only for some square millimeter arrays, for example, chips used in wrist watches.

Typically the anisotropic adhesives described in the previous art do not take an advantage of the synergistic elastic properperties of metal-polymer composites. Thus, for example, in the anisotropically conductive film described by Yamaguchi et al., the conducting straight wires are merely glued together by the polymer, and therefore the elastic properties of the system are very closely 100% determined by the conductive wires alone. The same is true also for the anisotropically conductive film described in U.S. Pat. No. 5,101,553.

On the other hand, Ayala-Equillin et al., and Shih et al. describe an anisotropically conductive film with inclined straight wires. Because the wires are relatively rigid in comparison to polymer, they merely tilt as solid bodies during compression of the composite film, and therefore the deformation resistance in this case is determined almost entirely by the polymer matrix alone. These examples should be contrasted to the teachings of present invention, in which both the conductive structures and the elastomeric matrix deform elastically, such that there exist strong elastic interactions between the deforming bodies.

As a summary, the LGA interposers of the prior art suffer from at least 2 or more of the drawbacks:

High manufacturing cost (for density and I/O)

High insertion force for dense or large arrays

Difficulty of reaching high I/O at high density

High profile (a drawback for high frequency and laptop form factor)

Long term reliability is a concern with designs using an elastomer

Adding discrete components, such as decoupling capacitors, is difficult when the insertion force is high, as this necessitates large clamp structures obstructing large areas of printed circuit board.

Adding shielding for noise and impedance control is difficult.

SUMMARY OF THE INVENTION

The present invention is directed to an interposer, useful as an electrical contact element in an interposer for a land grid array, using resilient, continuous conducting elements, as wires, strips, or other suitably shaped metal elements, to form continuous conducting structures through the interposer; the conducting structures are embedded in a resilient polymer matrix. Such metal-polymer composites possess a combination of elastic properties that are impossible to obtain by either component alone. The invention provides a suitably large compressibility of the interposer at a suitably small contact force, combined with a high local pressure at the conducting structures, conducive to the establishment of a suitably low contact resistance.

By changing the shape, number, and rigidity of the conducting elements as well as the shape and rigidity of the polymer body, the contact resistance, contact force, and compressibility can be selected within a wide range to meet the needs of the particular application.

The conducting elements may be embedded in conductive buttons or as conductive areas in a continuous sheet of insulating material The electrical connection is thereby established between the land grid array and the electrical circuit component through the button or element.

In one embodiment, the invention is an interposer for a land grid array comprising a dielectric grid having an array of holes therethrough with a resilient, conductive button as described disposed in one or more of the holes. The interposer can be used as an interconnecting device in an electrical assembly between an integrated circuit package and a printed circuit board. The conductive buttons contact the contact pads on the integrated circuit package and the contact pads on the printed circuit board to establish the electrical connection between the two components.

In another embodiment, the invention is directed to an interposer for a land grid array comprising a resilient, dielectric block having a first surface and a second surface, and a plurality of conducting elements positioned within the block having areas of contact with the block and extending from the first surface to the second surface of the block. The conducting elements in the interposer match to contact pads on circuit boards or modules to be connected. The plurality of conducting elements have sufficient flexibility such that they and the dielectric matrix deform on compression or relaxation essentially uniformly. This allows the interposer when sandwiched between and interconnecting a land grid array and an electrical circuit component to establish and maintain electrical contact between each of the conducting elements at the first surface and at the second surface with an opposing contact pad of the land grid array and an opposing contact pad of the electrical circuit component and thereby electrically connect the two. The interposer again can be a component in an electrical assembly as described above.

In addition to the mechanical design, the present invention teaches methods of electrical design to control the electrical characteristics of the interposer, including crosswinding the conductive elements, shielding the conductive elements, and attaching discrete electrical components to the interposer.

DETAILED DESCRIPTION OF THE INVENTION

Figure 1:
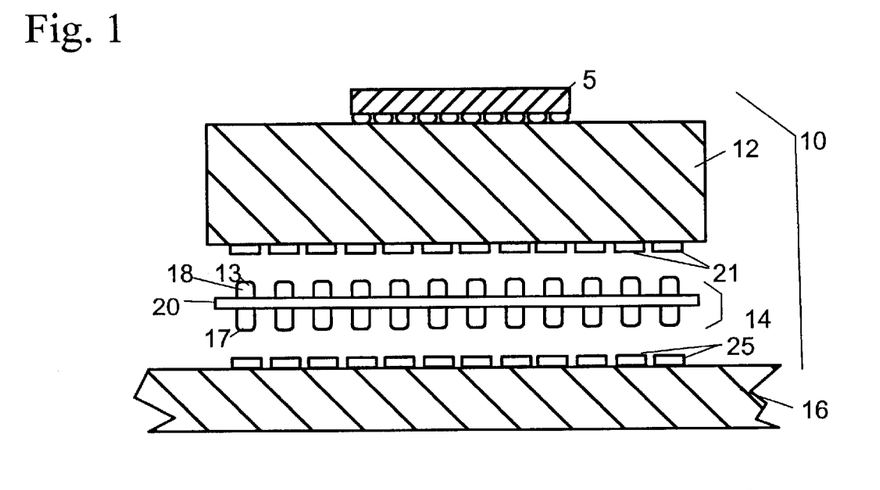
FIG. 1 shows a front elevation exploded view of a land grid array/circuit board assembly of the invention.
Figure 2:
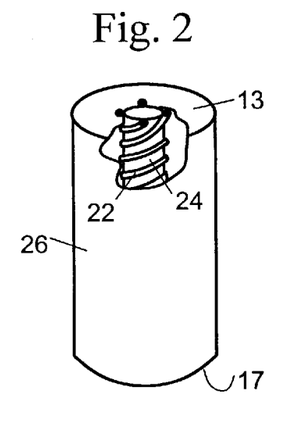
FIG. 2 shows a perspective view of a resilient conductive button with the outer shell partially cut away to expose details of the interior structure of the invention.

Referring first to FIGS. 1 and 2, electrical assembly 10 comprises an electronic component such as an integrated circuit 5 mounted on a chip carrier 12 having a number of contact pads 21 arranged in a "land grid array" across one surface, another electronic component such as printed circuit board 16, having a matching land grid array of contact pads 25 on a facing surface, and an interposer 14 having an array of contact buttons 18 for making contact between the two facing contact pad arrays. Interposer 14 comprises an array of resilient conductive buttons 18, each of which is inserted into a hole in dielectric grid 20.

When the first component 12 is aligned with the second component 16, with the interposer 14 between, the buttons 18 form the electrical connection between the contact pad arrays 21 and 25. The resilience of the buttons 18 allows for some degree of nonplanarity in the components, while maintaining good electrical contact between the land grid arrays of contacts.

In the embodiment illustrated in FIG. 2, each button 18 comprises flexible conducting element 22 wound around a compressible insulating core 24 extending from first end 13 to second end 17 of button 18. Core 24 can comprise an insulating yarn or other suitable dielectric material.

Compressible outer shell 26 surrounds flexible conducting element 22 and has contact areas with conducting element 22 and core 24. Element 22 and core 24 preferably are embedded in shell 26 which is preferably an elastomer, and the shell-to-conducting element contact areas are consequently along substantially the entire surfaces of element 22. Preferred elastomers for shell 26 include silicone rubber, neoprene, polybutadiene, or similar substances.

The rigidity of the conducting element 22 is chosen so that when button 18 is compressed or the compressive force is released, the contact areas urge an identical or substantially corresponding displacement in both element 22 and shell 26. This allows ends 13 and 17 of button 18 to establish and maintain contact with contact pad 21 of array 12 and contact pad 25 of board 16, respectively, and to make the electrical connection between corresponding pads 21 and 25 by means of the electrical conductors running through button 18.

By changing the shape, number, and rigidity of the conducting elements as well as the shape and rigidity of the polymer body, the contact resistance, contact force, and compressibility can be selected within a wide range to meet the needs of the particular application.

Figure 11:
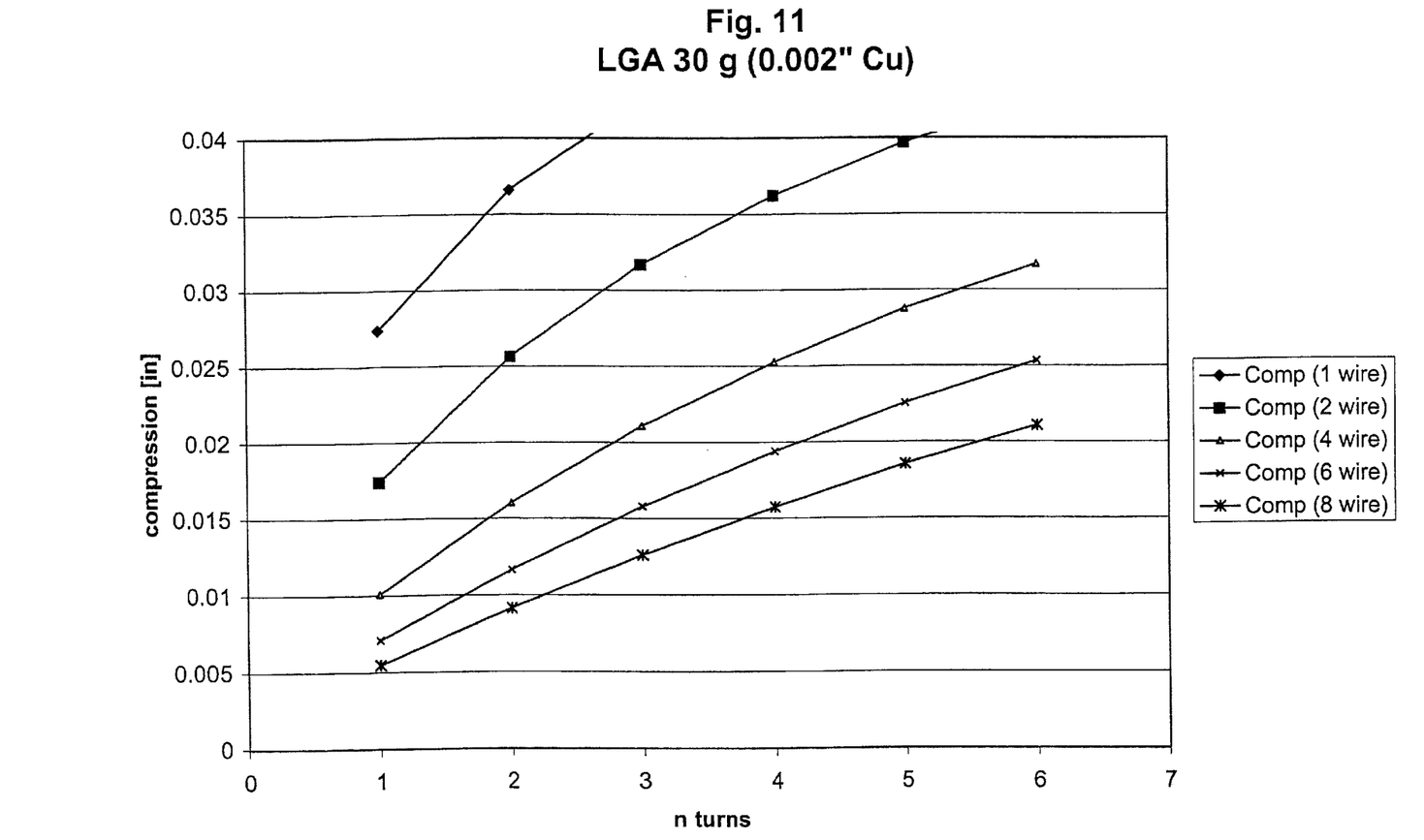
FIG. 11 shows a graph of compression vs. turns for an interposer of the invention.

As an example consider a composite button, say, of 40 mil height and 25 mil diameter with elastomer rubber matrix. In the elastomer there are embedded a number of conducting helical wire elements. By using the basic formulas for open coiled helical springs as taught in S. Timoshenko, *Strength of Materials II, VanNostrand, Princeton*, 1956, section 54 (pp. 292–299), we can construct design diagrams to optimize the button structures to yield, say 10 mil displacement under compression at 30 gram load. FIG. 11 shows such a diagram with the assumption that we use Be-copper wires of 2 mil diameter coiled around the button axis to 15 mil diameter.

From the diagram of FIG. 11 we can readily estimate that, for example, using 4 conducting elements (wires), we need to use one turn per initial 40 mil length to yield the desired 10 mil compression distance at 30 gram load. Further, by estimating that load is proportional to displacement, we see that about 5 gram load resides on each conducting element, giving a nominal contact pressure of 25 MPa at each tip. Because during compression the wire tips are both rotated (see Timoshenko) and swept radially out (because of the approximate conservation of the elastomer volume), the wiping action combined with the pressure facilitates the formation of a redundant, low resistance contact.

Figure 3A:
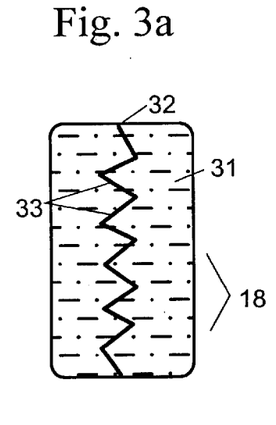
FIGS. 3a–3e show cut-away views of alternate embodiments of the contact buttons of FIG. 1.
Figure 3B:
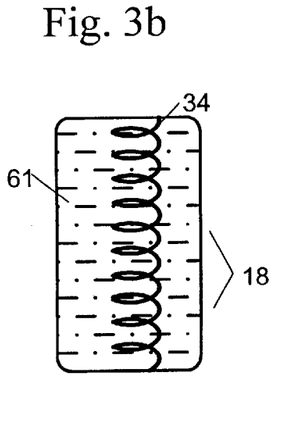
Figure 3C:
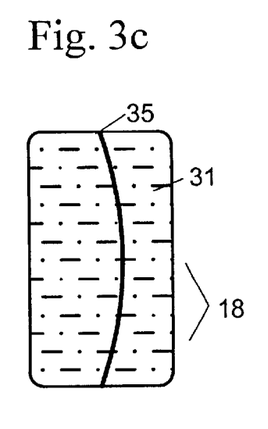
Figure 3D:
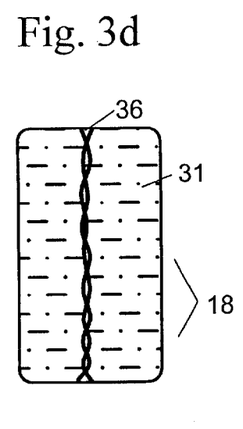
Figure 3E:
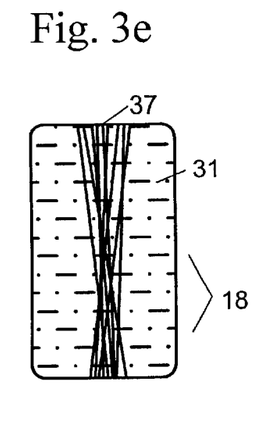

FIGS. 3a through 3e show alternate embodiments of the conductive buttons 18, in which the resilient button body 31 is formed of one piece, rather than layered as in FIG. 2. In FIG. 3a, the conductive element 32 is a fine wire, formed in zig-zags or pleats 33. In FIG. 3b, the wire is coiled 34. In its simplest form, shown in FIG. 3c, the conductive element can be a fine wire 35, bent in a slight arc so as to reduce its stiffness. FIG. 3d shows the conductive element 36 as a twisted pair of thin wires, and in FIG. 3e a plurality of thin wires 37 are used.

In all of these embodiments, FIG. 2 and FIGS. 3a–3e, the wire or other conductive element is completely embedded in, and may be supported by, the body of the button, since it is too fine and flexible to stand on its own. Alternatively, the conductive element may contribute significantly to the mechanical resistance of the resilient button itself to compressive or relaxing force.

The overall cumulative contact force of buttons 18 against contact surfaces 19 and 23 is low due to the resilient construction and compressibility of buttons 18, and is preferably in the range of approximately 20 to 40 grams per button. Additionally, buttons 18 establish and maintain contact between each element 22 and its corresponding contact pads 21 and 25 at a high localized contact force, sufficient to induce plastic yielding.

Another factor in producing a low overall contact force is limiting the number of continuous conducting elements per unit surface area or volume of button body. The number and conductivity, however, of conducting elements should be selected so as to produce a low total resistance to the interposer, preferably in the range of 10 milliohms or less per button.

The angle of conducting element 22 at the surface of button 18, which is determined in the case of a winding or coil by the pitch, is a design parameter that bears a direct relation to the contact pressure required—the steeper (more vertical) the angle, the higher the force required.

Suitable materials for conducting element 22 include gold, copper, and other metals or metal alloys of low specific resistivity. Non-noble metals can be plated or coated with a barrier metal covered with a surface structure of gold or other noble metals to ensure chemical inertness and provide suitable asperity distribution to facilitate good metal-to-metal contact.

Figure 4:
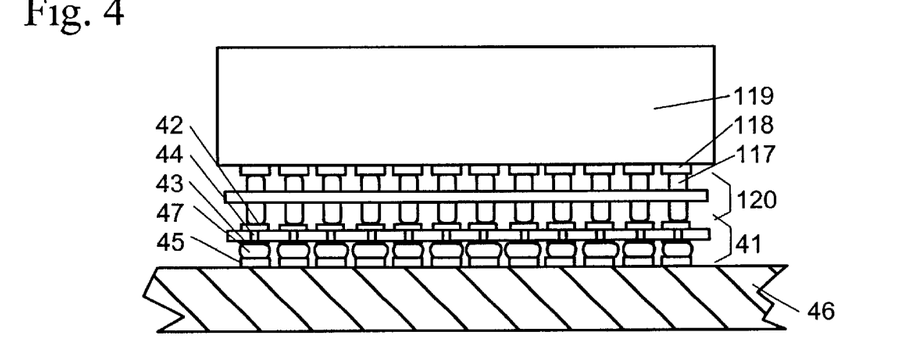
FIG. 4 shows an auxiliary interposer which can be used with the interposer of the invention.

FIG. 4 shows another application of the interposer of the invention. In the prior art, it is common to plate the LGA pads 45 on a mother board 46 with a noble metal such as gold, prior to soldering and assembly. Some CPU board manufacturers would like to eliminate this expensive noble metal plating, as well as other similar applications such as memory modules and memory chips. As shown in FIG. 4, in addition to the novel interposer 120 of the invention, an auxiliary interposer 41 may be used. The auxiliary interposer 41 has noble metal plated pads 42 to accept the CPU-module 119, connected by vias 44 to standard Surface Mount Technology (SMT) bottom pads 43. With this arrangement, manufacturers can use conventional SMT techniques to solder 47 this auxiliary interposer 41 to mother-board 46, just as they do for all other components on board. The interposer of the invention 120 is then used between the auxiliary interposer 31 and the CPU module 119 or other device, and the conductive buttons 117 provide the connection between the CPU 119 pads 118 and the pads 42 of the auxiliary interposer 41 soldered 47 to the pads 45 of the motherboard 46.

It is possible within the teachings of the invention, as well, to physically connect an LGA interposer of the invention directly to SMT pads on a motherboard, rather than just compressing the interposer between the module and the board. In this application, the conducting elements in the interposer may be permanently connected to the matching board or module pads by soldering, conductive adhesives, or other suitable means.

Figure 5:
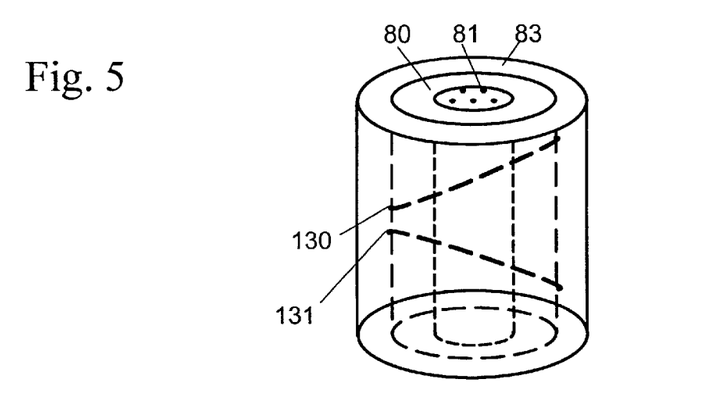
FIG. 5 shows the resilient button of FIG. 8, in an embodiment using a plurality of cross-wound conductors.

The novel LGA interposer of the invention is well suited to high frequency applications because of the low inductance and capacitance of the short signal paths and small volumes of conducting wires. Further tailoring of enhanced high frequency properties is possible as exemplified by the following steps:

First, for high frequency applications, as shown in FIG. 3d, the conducting elements 33 preferably comprise twisted pairs of wires or are cross wound to reduce inductive losses. FIG. 5 shows that this arrangement is also applicable to the embodiment of FIG. 2. In this figure, the wire conductors are wound both clockwise 130 and counter clockwise 131. FIG. 5 also shows that the windings 130 and 131 can be wound with a pitch such that the windings make one full turn in the length of a button.

Figure 6:
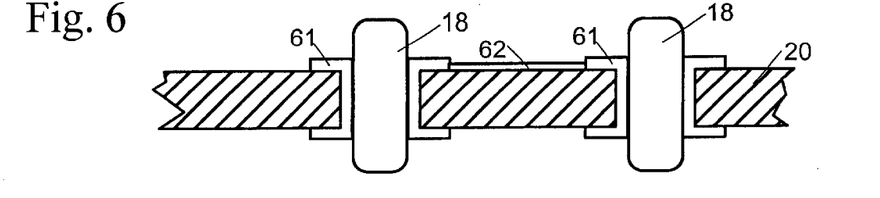
FIGS. 6 shows a method of establishing grounded shielding around the connector by having an interposer body with an area array of printed-through-holes into which the conductive buttons are inserted.

Second, as shown in FIG. 6, the holes for conductive buttons 18 in the body of the interposer 20, could be plated-through-holes (PTH's) 61, suitably grounded by traces 62 on the interposer body 20. This will provide additional shielding of electromagnetic noise.

Figure 7:
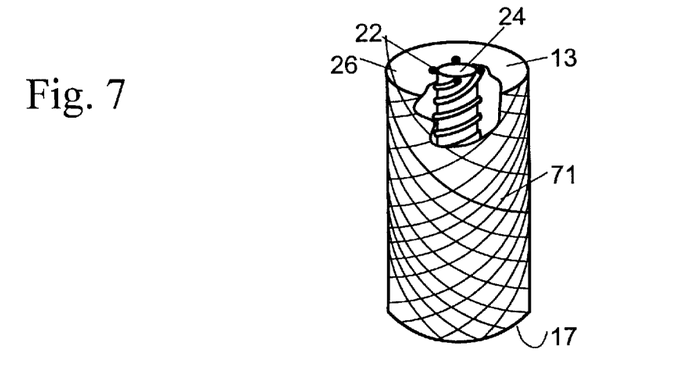
FIG. 7 shows a resilient button of FIG. 2 with an outer wound wire mesh for shielding.

Alternatively, as shown in FIG. 7, the conductive buttons themselves could be shielded with a shielding layer made of wire mesh or, alternatively, a continuous metallic layer, provided surrounding the insulating layer 13 over the inner lying signal wires 22. This arrangement is analogous to co-axial cables where the central conductor is surrounded by an outer conductive shield. The shielding layer 71 may, if desired, be protected by an additional dielectric layer 72.

Finally, the characteristics of the interposer of the invention may be optimized within the teachings of the invention by careful selection of the material for interposer body based on such factors as cost, rigidity, thermal stability, and inertness to humidity and air and chemical impurities. Suitable materials for the interposer body include polymers having a low and uniform dielectric constant, such as here?

.

The conductive buttons 18 of the interposer can be manufactured by first making a cable-like structure by extrusion and then cutting it into short pieces. Buttons 18 may also be made by other conventional methods such as injection molding. Several methods of manufacture are detailed below.

For example, the conductive wire structures shown in FIGS. 3a–3e can be manufactured by injection molding the conductive wires into separate buttons, which can then be inserted to holes in the interposer body. Alternatively, by suitable arrangements, the conductive elements could be injection molded in place into the area array holes of the interposer body.

Figure 8A:
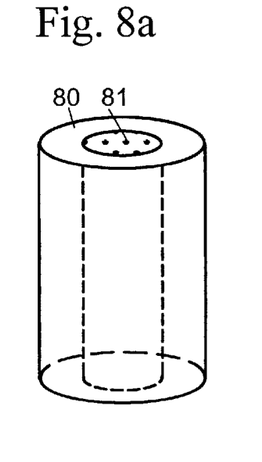
FIGS. 8a–8c a method of making a contact element as shown in FIG. 2 by cable technology.
Figure 8B:
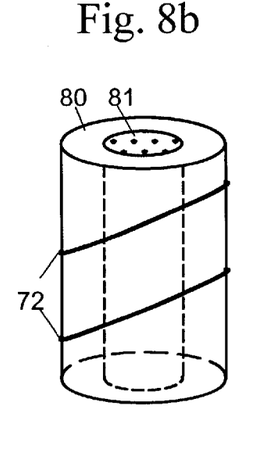
Figure 8C:
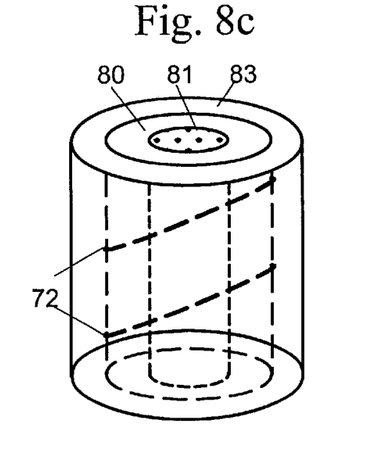

Alternatively, the conductive elements as shown in FIG. 2 may be formed through a cable forming process, as shown in FIGS. 8a to 8c.

First (FIG. 8a), an insulating core 80 is formed, possibly with additional central fibers 81. The core may be formed in any convenient length, as may be desirable for the manufacturing process.

Then (FIG. 8b), the conductive wire 82 is wound helically around the core 80.

The core 80 with wound wires 82 is then surrounded by an elastomeric mantle 83 (FIG. 8c).

Finally, the cable can conveniently be cut into separate cylindrical buttons, as shown in FIG. 2, and subsequently placed on a carrier (FIG. 1, 20), to form an area array LGA interposer.

Figure 9:
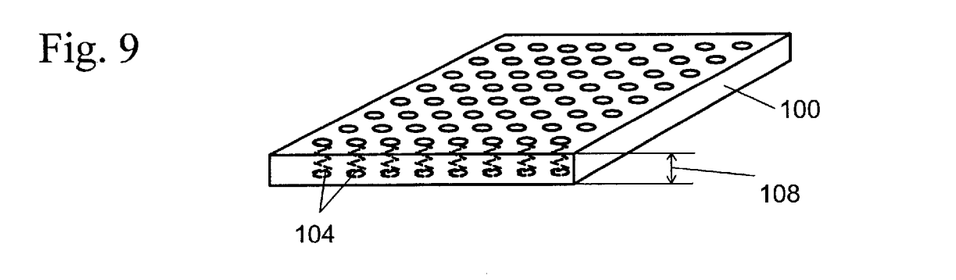
FIG. 9 shows a perspective view of an interposer, fabricated as shown in FIG. 10, with the conducting elements shown in phantom.
Figure 10:
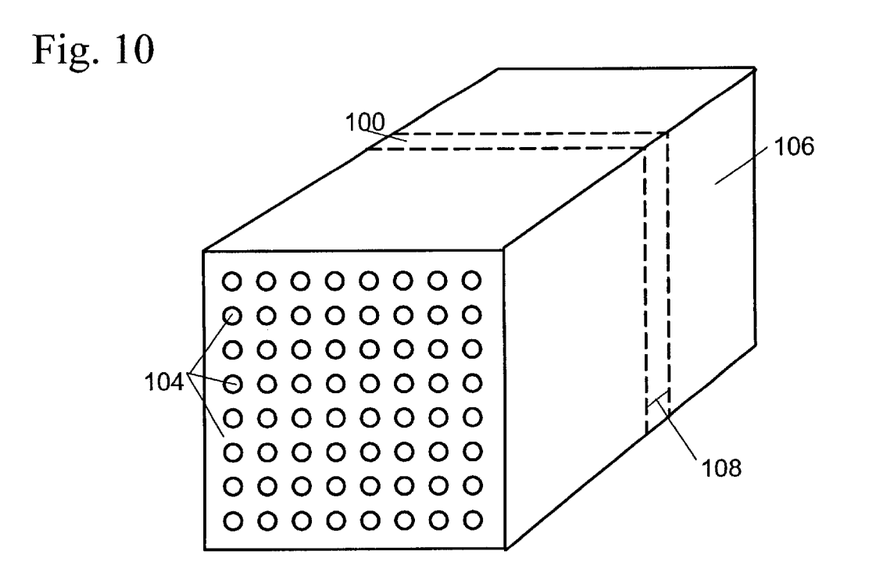
FIG. 10 shows a perspective view of an elastic block containing conducting elements useful for fabricating interposers of the invention.

FIGS. 9 and 10 illustrate another embodiment of the invention, in which the electrically conductive elements 104 of the interposer 100 are made of conductors embedded in a sheet of dielectric material, rather than being resilient buttons separate from the carrier sheet, as described in the first embodiment, above.

FIG. 9 shows the interposer 100 of this embodiment. The interposer 100 comprises a resilient insulating sheet-carrier, into which are incorporated conducting elements 104. The sheet preferably has a thickness 108 in the range of 20 to 40 mils. As in the above-described button 18 embodiment, conducting elements 104 have sufficient contact areas with the sheet such that under compression or relaxation the carrier urges conducting elements 104 into corresponding displacements.

FIG. 10 describes a method of manufacturing of this embodiment:

Long conducting structures, which might be wires of the arrangements shown for the conductors in FIGS. 3a–3e, or the multi-layer arrangements of FIG. 8c, or some other design within the teachings of the invention, are formed.

The conducting structures stacked in an array such that the pitch of the conducting elements matches the pitch of contact pads 21 and 23 to be connected by the interposer. For this application "long" means more than the thickness 108 of a single resulting interposer 100.

The array of conductors is placed in a mold having dimensions matching those of the perimeter of the desired interposer.

The mold is filled with a resin such as silicone rubber, neoprene, polybutadiene, or similar substances, filling the gaps between the conducting structures The resin is cured to form a block 106.

Then, individual interposers 100 are sliced from block 106 as sheets or planar sections having the desired thickness 108.

In general, the interposer 100 can be formed from any of the materials as described above for shell 26, FIG. 2, and the flexibility and other characteristics of the individual and combined structures, such as the flexibility of conducting elements 104, and their preferred parameters and materials of construction described above, also apply to the present embodiment.

Decoupling capacitors may be incorporated into the interposer of the invention, using the techniques described in Bandyyopahyay, et. al, "Importance of Damping and Resonance in Thin-Film Integrated Decoupling Capacitor Design" (*Proceedings of the 6$^{th}$ Topical Meeting on Electrical Performance ofElectronic Packaging*, 1997, pages 31–34, IEEE no. 0-7803-4203-8/97) or Beker, et. al, "Electrical Performance of Integrated Decoupling Capacitor Arrays" (*Proceedings of the 5$^{th}$ Topical Meeting on Electrical Performance of Electronic Packaging*, 1996, pages 83–85, IEEE no. 0-7803-3514-7/96).

With the new designs described for both types of novel LGA interposers, the following advantages can be achieved:
a) Low contact force and resistance—controlled by the choice of polymer material and button dimensions and shape, number and diameter of wires (and wire cross section, if the wires are not circular), and the shape and arrangement of wire segments;
b) High I/O count and large area array - the wire form enables scaleability for high density, and Coefficient of Thermal Expansion (CTE) matching to organic boards enables large arrays;
c) Low profile—needed for high frequency applications and for laptop form factor.
d) High reliability—due to large compliance, a uniform contact force among buttons which means that planarity is not an issue. Redundancy, contact force, and mechanical compliance, can be controlled in a wide range by the number and rigidity of contacting wires.
e) Smaller clamping structures—the small size of the clamping structures needed to maintain the contact force allows a larger opening for passives as capacitors.
f) Controllable electrical performance—tailored by number, diameter, and arrangement of wires, and special grounding and shielding structures which make very high frequency and high current applications possible.
g) Low cost—the simple design (wires embedded in polymer buttons or sheet) is easy to manufacture.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A resilient, conductive button useful as an electrical contact element between conductive pads, comprising:
    a) a resilient body having a first end and a second end and a length therebetween;
    b) a conducting element comprising at least one thin wire formed in a spiral extending continuously through the length of the body from the first end of the body to the second end of the body, being electrically exposed at both ends of the body;
    such that when the first end of the body contacts a first conductive pad, and the second end of the body contacts a second conductive pad, the conductive element forms an electrically conductive path through the button from the first conductive pad to the second conductive pad; and
    the conducting element has sufficient flexibility such that the conducting element does not add substantially to the compressibility or relaxability of the resilient body.

2. The conductive button of claim 1, in which the resilient body is formed of an elastomer.

3. The conductive button of claim 2, in which the elastomer is selected from the group comprising silicon rubber, neoprene or polybutadiene.

4. The conductive button of claim 1, in which the conducting element is made of a material selected from a group comprising gold, copper and metal alloys.

5. A resilient, conductive button useful as an electrical contact element between conductive pads, comprising:
    a) a resilient body having a first end and a second end and a length therebetween:
    b) a conducting element comprising a plurality of wires twisted together extending continuously through the length of the body from the first end of the body to the second end of the body, being electrically exposed at both ends of the body;
    such that when the first end of the body contacts a first conductive pad, and the second end of the body contacts a second conductive pad, the conductive element forms an electrically conductive path through the button from the first conductive pad to the second conductive pad; and
    the conducting element has sufficient flexibility such that the conducting element does not add substantially to the compressibility or relaxability of the resilient body.

6. The conductive button of claim 1, in which there are a plurality of wires, each wire being wound in a spiral having a direction of wind, and the direction of wind of at least one of the wires is an opposite direction to the direction of wind of at least one of the other wires.

7. A resilient, conductive button useful as an electrical contact element between conductive pads, comprising:
    a) a resilient body having a first end and a second end and a length therebetween:
    b) a conducting element extending continuously through the length of the body from the first end of the body to the second end of the body, being electrically exposed at both ends of the body: and
    c) an electrically conductive shielding layer surrounding substantially all of the length of the resilient body, insulated from the conducting element;
    such that when the first end of the body contacts a first conductive pad, and the second end of the body contacts a second conductive pad, the conductive element forms an electrically conductive path through the button from the first conductive pad to the second conductive pad; and
    the conducting element has sufficient flexibility such that the conducting element does not add substantially to the compressibility or relaxability of the resilient body.

8. The conductive button of claim 7, in which the shielding layer is a conductive wire mesh.

9. The conductive button of claim 7, in which the shielding layer is a continuous metallic layer.

10. The conductive button of claim 7, further comprising an insulating layer surrounding the shielding layer.

11. A resilient, conductive button useful as an electrical contact element between conductive pads, comprising:

a) a resilient body having a first end and a second end and a length therebetween: comprising:
   i) a resilient insulating core having a first end and a second end and a length therebetween, and
   ii) a resilient insulating outer shell surrounding the length of the insulating core; and
b) a conducting element extending continuously through the length of the body from the first end of the body to the second end of the body, being electrically exposed at both ends of the body; comprising a conductor between the insulating core and the insulating outer shell, extending from a first end of the insulating core to the second end of the insulating core;

such that when the first end of the body contacts a first conductive pad, and the second end of the body contacts a second conductive pad, the conductive element forms an electrically conductive path through the button from the first conductive pad to the second conductive pad; and the conducting element has sufficient flexibility such that the conducting element does not add substantially to the compressibility or relaxability of the resilient body.

12. The conductive button of claim 11, in which the conducting element comprises at least one conductor wound around the core in a spiral.

13. The conductive button of claim 11, in which the conducting element comprises a plurality of conductors wound around the core in a spiral.

14. The conductive button of claim 13 in which at least one of the plurality of conductors is wound around the core in a spiral in the opposite direction from at least one of the other of the plurality of conductors.

15. The conductive button of claim 11, further comprising a shielding layer surrounding substantially all of the length of the resilient outer shell.

16. The conductive button of claim 15, in which the shielding layer is a conductive wire mesh.

17. The conductive button of claim 15, in which the shielding layer is a continuous metallic layer.

18. The conductive button of claim 15, further comprising an insulating layer surrounding the shielding layer.

19. An interposer for a land grid array, for providing conduction between a first and a second array of conductive pads at a predetermined contact force, the interposer comprising:

a dielectric grid having an array of holes therethrough; and a plurality of resilient, conductive buttons disposed in the array of holes, each comprising:
   a) a resilient body having a first end and a second end and a length therebetween;
   b) a conducting element comprising at least one thin wire formed in a spiral extending continuously through the length of the body from the first end of the body to the second end of the body, being electrically exposed at both ends of the body;

such that when the interposer is placed between the first and second array of contact pads, the first end of the body contacts a conductive pad in the first array of contact pads, and the second end of the body contacts a second conductive pad in the second array of contact pads, the conductive element forms an electrically conductive path through the button from the first conductive pad to the second conductive pad; and the resilient body and conducting element being chosen such that the contact force is a preselected value.

20. The interposer of claim 19, in which the resilient body of the conductive buttons is formed of an elastomer.

21. The conductive button of claim 20, in which the elastomer is selected from the group comprising silicon rubber, neoprene or polybutadiene.

22. The conductive button of claim 19, in which the conducting element is made of a material selected from a group comprising gold, copper and metal alloys.

23. The interposer of claim 19, in which the array of holes in the dielectric grid are plated through the dielectric.

24. The interposer of claim 23, in which the plating on at least some of the holes are electrically connected.

25. An interposer for a land grid array, for providing conduction between a first and a second array of conductive pads at a predetermined contact force, the interposer comprising:

a dielectric grid having an array of holes therethrough; and a plurality of resilient, conductive buttons disposed in the array of holes, each comprising:
   a) a resilient body having a first end and a second end and a length therebetween;
   b) a conducting element comprising a plurality of wires, twisted together extending continuously through the length of the body from the first end of the body to the second end of the body, being electrically exposed at both ends of the body;

such that when the interposer is placed between the first and second array of contact pads, the first end of the body contacts a conductive pad in the first array of contact pads, and the second end of the body contacts a second conductive pad in the second array of contact pads, the conductive element forms an electrically conductive path through the button from the first conductive pad to the second conductive pad; and the resilient body and conducting element being chosen such that the contact force is a preselected value.

26. The interposer of claim 25, in which one of the first or second array of conductive pads is an auxiliary interposer comprising an array of metallic conductors matching the array of conductive buttons, each metallic conductor having an upper surface for contact with the conductive buttons of the interposer, and a lower surface for conductive attachment to a circuit, the upper surface of the auxiliary interposer being plated with a noble metal.

27. An interposer for a land grid array for providing conduction between a first and a second array of conductive pads at a predetermined contact force, the interposer comprising:

a dielectric grid having an array of holes therethrough; and a plurality of resilient, conductive buttons disposed in the array of holes, each comprising:
   a) a resilient body having a first end and a second end and a length therebetween:
   b) a conducting element extending continuously through the length of the body from the first end of the body to the second end of the body, being electrically exposed at both ends of the body; and
   c) an electrically conductive shielding layer surrounding substantially all of the length of the resilient body, insulated from the conducting element;

such that when the interposer is placed between the first and second array of contact pads, the first end of the body contacts a conductive pad in the first array of contact pads, and the second end of the body contacts a second conductive pad in the second array of contact pads, the conductive element forms an electrically conductive path through the button from the first conductive pad to the second conductive pad; and the resilient body and conducting element being chosen such that the contact force is a preselected value.

28. The conductive button of claim 27, in which the shielding layer is a conductive wire mesh.

29. The conductive button of claim 27, in which the shielding layer is a continuous metallic layer.

30. The conductive button of claim 27, further comprising an insulating layer surrounding the shielding layer.

31. The interposer of claim 27, in which one of the first or second array of conductive pads is an auxiliary interposer comprising an array of metallic conductors matching the array of conductive buttons, each metallic conductor having an upper surface for contact with the conductive buttons of the interposer, and a lower surface for conductive attachment to a circuit, the upper surface of the auxiliary interposer being plated with a noble metal.

32. An interposer for a land grid array, for providing conduction between a first and a second array of conductive pads at a predetermined contact force, the interposer comprising:

a dielectric grid having an array of holes therethrough: and a plurality of resilient, conductive buttons disposed in the array of holes, each comprising:
  a) a resilient body having a first end and a second end and a length therebetween; comprising:
    i) a resilient insulating core having a first end and a second end and a length therebetween, and
    ii) a resilient insulating outer shell surrounding the length of the insulating core; and
  b) a conducting element extending continuously through the length of the body from the first end of the body to the second end of the body, being electrically exposed at both ends of the body; comprising a conductor between the insulating core and the insulating outer shell, extending from a first end of the insulating core to the second end of the insulating core such that when the interposer is placed between the first and second array of contact pads, the first end of the body contacts a conductive pad in the first array of contact pads and the second end of the body contacts a second conductive pad in the second array of contact pads, the conductive element forms an electrically conductive path through the button from the first conductive pad to the second conductive pad, and the resilient body and conducting element being chosen such that the contact force is a preselected value.

33. The interposer of claim 32, in which the conducting element comprises at least one conductor wound around the core in a spiral.

34. The interposer of claim 33, in which the conducting element comprises a plurality of conductors wound around the core in a spiral having a direction of wind.

35. The interposer of claim 34, in which the direction of wind of at least one of the wires is an opposite direction to the direction of wind of at least one of the other wires.

36. The conductive button of claim 32, further comprising a shielding layer surrounding substantially all of the length of the resilient outer shell.

37. The conductive button of claim 36, in which the shielding layer is a conductive wire mesh.

38. The conductive button of claim 36, in which the shielding layer is a continuous metallic layer.

39. The conductive button of claim 36, further comprising an insulating layer surrounding the shielding layer.

40. The interposer of claim 19, in which one of the first or second array of conductive pads is an auxiliary interposer comprising an array of metallic conductors matching the array of conductive buttons, each metallic conductor having an upper surface for contact with the conductive buttons of the interposer, and a lower surface for conductive attachment to a circuit, the upper surface of the auxiliary interposer being plated with a noble metal.

41. An interposer for a land grid array, for providing conduction between a first and a second array of conductive pads, the interposer comprising:

a) a resilient, dielectric sheet having a first surface and a second surface; and b) a plurality of conducting elements each comprising at least one thin wire formed in a spiral positioned within the sheet, extending from the first surface to the second surface, and the conducting elements are positioned within the sheet only in locations corresponding to the conductive pads in the first and second arrays of conductive pads, such that when the interposer is placed between the first and second array of contact pads, the conductive elements form an electrically conductive path from the a conductive pad in the first array to a conductive pad in the second array.

42. The interposer of claim 41, in which the sheet comprises an elastomer.

43. The interposer of claim 42, in which the elastomer is selected from the group comprising silicon rubber, neoprene or polybutadiene.

44. The interposer of claim 41, in which the plurality of conducting elements are embedded in the elastomer.

45. An interposer for a land grid array, for providing conduction between a first and a second array of conductive pads, the interposer comprising:

a) a resilient, dielectric sheet having a first surface and a second surface; and b) a plurality of conducting elements each comprising a plurality of wires twisted together positioned within the sheet, extending from the first surface to the second surface, and the conducting elements are positioned within the sheet only in locations corresponding to the conductive pads in the first and second arrays of conductive pads, such that when the interposer is placed between the first and second array of contact pads, the conductive elements form an electrically conductive path from the a conductive pad in the first array to a conductive pad in the second array.

46. The interposer of claim 45, in which one of the first or second array of conductive pads is an auxiliary interposer comprising an array of metallic conductors matching the array of conductive elements, each metallic conductor having an upper surface for contact with the conductive elements of the interposer, and a lower surface for conductive attachment to a circuit, the upper surface of the auxiliary interposer being plated with a noble metal.

47. The conductive button of claim 41, in which each of the thin wires is wound in a spiral having a direction of wind, and the direction of wind of at least one of the wires is an opposite direction to the direction of wind of at least one of the other wires.

48. The interposer of claim 41, in which one of the first or second array of conductive pads is an auxiliary interposer comprising an array of metallic conductors matching the array of conductive elements, each metallic conductor having an upper surface for contact with the conductive elements of the interposer, and a lower surface for conductive attachment to a circuit, the upper surface of the auxiliary interposer being plated with a noble metal.

* * * * *